United States Patent [19]
Jordan et al.

[11] Patent Number: 5,793,596
[45] Date of Patent: Aug. 11, 1998

[54] FLOATING POSITIVE CIRCUIT BREAKER

[76] Inventors: Mark G. Jordan, 11 Orchard Hill Rd., Goffstown, N.H. 03102; John A. O'Connor, 10 Westminster La., Merrimack, N.H. 03054; James R. Garrett, 20 Cobbett St., Tewksbury, Mass. 01876

[21] Appl. No.: 719,660

[22] Filed: Sep. 25, 1996

Related U.S. Application Data

[63] Continuation-in-part of Ser. No. 231,374, Apr. 22, 1994, Pat. No. 5,581,433.

[51] Int. Cl.$^6$ .................................................. H02H 3/00
[52] U.S. Cl. ............................................. 361/98; 361/18
[58] Field of Search ........................... 361/18, 54, 56, 361/57, 58, 78, 79, 86, 87, 88, 89, 93, 94, 95, 96, 97, 98

[56] References Cited

U.S. PATENT DOCUMENTS

| | | | |
|---|---|---|---|
| 4,174,496 | 11/1979 | McFall et al. | 323/9 |
| 4,331,997 | 5/1982 | Engel et al. | 361/93 |
| 4,331,998 | 5/1982 | Matsko et al. | 361/93 |
| 4,331,999 | 5/1982 | Engel et al. | 361/94 |
| 4,335,413 | 6/1982 | Engel et al. | 361/96 |
| 4,335,437 | 6/1982 | Wilson et al. | 364/483 |
| 4,338,647 | 7/1982 | Wilson et al. | 361/96 |
| 4,351,012 | 9/1982 | Elms et al. | 361/96 |
| 4,351,013 | 9/1982 | Matsko et al. | 361/96 |
| 4,371,824 | 2/1983 | Gritter | 361/18 |
| 4,377,836 | 3/1983 | Elms et al. | 361/96 |
| 4,377,837 | 3/1983 | Matsko et al. | 361/105 |
| 4,428,022 | 1/1984 | Engel et al. | 361/96 |
| 4,445,183 | 4/1984 | McCollum et al. | 364/483 |
| 4,476,511 | 10/1984 | Saletta et al. | 361/96 |
| 4,539,618 | 9/1985 | Stich | 361/94 |
| 4,544,981 | 10/1985 | Hakoopian | 361/93 |
| 4,603,366 | 7/1986 | Michener | 361/56 |
| 4,631,625 | 12/1986 | Alexander et al. | 361/94 |
| 4,682,264 | 7/1987 | Demeyer | 361/96 |
| 4,689,712 | 8/1987 | Demeyer | 361/96 |
| 4,694,373 | 9/1987 | Demeyer | 361/96 |
| 4,710,845 | 12/1987 | Demeyer | 361/96 |
| 4,717,985 | 1/1988 | Demeyer | 361/96 |
| 4,740,883 | 4/1988 | McCollum | 364/140 |
| 4,751,605 | 6/1988 | Mertz et al. | 361/91 |
| 4,766,416 | 8/1988 | Noujaim | 340/347 |
| 4,780,786 | 10/1988 | Weynachter et al. | 361/87 |
| 4,780,787 | 10/1988 | Dano et al. | 361/96 |
| 4,825,330 | 4/1989 | Walchle | 361/95 |
| 4,831,327 | 5/1989 | Chenier et al. | 324/127 |
| 4,878,144 | 10/1989 | Nebon | 361/96 |
| 4,882,557 | 11/1989 | Harper | 335/9 |
| 4,914,541 | 4/1990 | Tripodi et al. | 361/94 |
| 4,996,646 | 2/1991 | Farrington | 364/483 |
| 5,119,265 | 6/1992 | Qualich et al. | 361/18 |
| 5,166,887 | 11/1992 | Farrington et al. | 364/483 |
| 5,170,360 | 12/1992 | Porter et al. | 364/483 |
| 5,185,705 | 2/1993 | Farrington | 364/483 |
| 5,270,898 | 12/1993 | Elms et al. | 361/96 |
| 5,386,336 | 1/1995 | Kim et al. | 361/93 |
| 5,394,296 | 2/1995 | Erickson, Jr. et al. | 361/659 |
| 5,428,553 | 6/1995 | Chiba et al. | 364/492 |
| 5,525,985 | 6/1996 | Schlotterer et al. | 341/136 |
| 5,581,433 | 12/1996 | Jordan | 361/93 |

OTHER PUBLICATIONS

Best Ideas for Design, Charge Pump Generates Gate Drive, Chester Simpson, 3360 Tracy Dr., Santa Clara, CA 95051; (408) 296–1925 Sep. 1995.

Unitrode Integrated Circuits Corp.."*Negative Voltage Circuit Breaker*", UCC1913, data sheet, Jan. 1995, pp. 6–442 thru 6–447.

Unitrode Integrated Circuits Corp., "*Programmable Electronic Circuit Breaker*", UCC3912, data sheet, Jan. 1995, pp. 6–437 thru 6–441.

*Primary Examiner*—Ronald W. Leja

[57] ABSTRACT

A circuit breaker IC adapted for controlling an external NMOS switch coupled between a supply voltage and a load referenced to ground, with the circuit breaker being isolated from ground. With this arrangement, the voltage across the circuit breaker is limited, thereby permitting use of a low voltage integrated circuit fabrication process. The circuit breaker includes a sensor for sensing load current through the switch and providing an output signal indicative of the load current, a charge pump providing a supply voltage and an amplifier responsive to the sensor output signal and to the charge pump supply voltage for providing a drive signal to control the switch.

10 Claims, 5 Drawing Sheets

FLOATING POSITIVE CIRCUIT BREAKER

This application is a continuation-in-part of U.S. patent application Ser. No. 08/231,374, filed: Apr. 22, 1994, entitled: ELECTRONIC CIRCUIT BREAKER, now U.S. Pat. No. 5,581,433.

FIELD OF THE INVENTION

This invention relates generally to circuit breakers and, more particularly, to a positive floating circuit breaker.

BACKGROUND OF THE INVENTION

Electronic circuit breakers are used to interrupt power to a load which is drawing excessive current and to limit current to the load. In particular, an electrical, mechanical or electromechanical switch is used to selectively connect or disconnect a supply voltage to and from the load.

Circuit breakers may be classified as either positive or negative circuit breakers, depending on the polarity of the voltage to which the circuit breaker is referenced. In particular, a positive circuit breaker generally is coupled between a positive supply voltage and a load referenced to ground, with the circuit breaker likewise being referenced to ground. A negative circuit breaker, on the other hand, is coupled between a load and a negative supply voltage, with the circuit breaker being referenced to ground.

Circuit breakers are sometimes fabricated on an integrated circuit (IC). However, the voltage handled by a monolithic circuit breaker is limited to the breakdown voltage of the silicon, thereby making such circuit breakers unsuitable in certain high voltage applications.

The circuit breaker switch may be internal to the IC or alternatively, may be an external device. Field Effect Transistors (FETs) are often used to provide the circuit breaker switch. Positive circuit breakers generally utilize a PMOS FET, since PMOS FETs require a readily generated drive voltage which is lower than the supply voltage. Since NMOS FETs require a drive voltage higher than the supply voltage, their use in a positive circuit breaker requires such a voltage to be generated. However, NMOS FETs have the advantages of lower drain-to-source resistance and cost, as compared to PMOS FETs.

SUMMARY OF THE INVENTION

A circuit breaker adapted for controlling a switch coupled between a positive supply voltage and a load referenced to a reference voltage such as ground is described, with the circuit breaker floating relative to ground (i.e. isolated from ground). The circuit breaker includes a sensor for sensing load current through the switch and providing an output signal indicative of the load current, a charge pump providing a supply voltage and an amplifier responsive to the sensor output signal and to the charge pump supply voltage for providing a drive signal to control the switch. Preferably, the switch is an NMOS FET.

Because the circuit breaker floats relative to ground, the voltage across the circuit breaker is limited by internal circuitry. Thus, the voltage limitation of an application in which the circuit breaker is used is restricted only by voltage limitations of external components and not by the circuit breaker itself. This arrangement permits a lower voltage process to be used to fabricate the circuit breaker IC, thereby reducing the cost of the circuit breaker.

Also described are methods of protecting a load from an overcurrent condition including the steps of providing an NMOS switch coupled between a positive supply voltage and a load referenced to a reference voltage and generating a drive signal to control the conduction of the switch with a circuit which floats relative to ground.

BRIEF DESCRIPTION OF THE DRAWINGS

The foregoing features of this invention, as well as the invention itself, may be more fully understood from the following detailed description of the drawings in which.

DESCRIPTION OF THE PREFERRED EMBODIMENT

Figure 1:
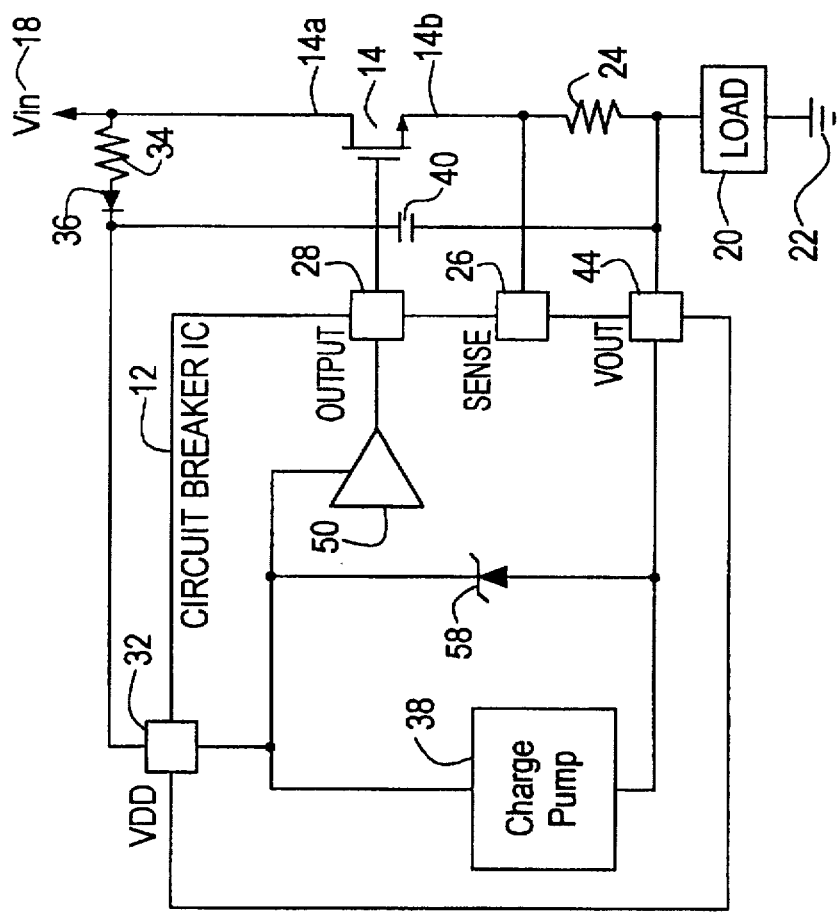
FIG. 1 is a schematic of a floating positive circuit breaker in accordance with the invention.

Referring to FIG. 1, a floating positive circuit breaker 10 includes a circuit breaker IC 12 adapted for driving a switching device 14, such as an NMOS FET. In the illustrative embodiment, the NMOS FET 14 is external to the chip 12 but, alternatively, may be integrated onto the chip. The NMOS FET 14 is coupled in series between a positive input voltage (Vin) 18 and a load 20 referenced to a reference voltage 22, such as ground as shown. More particularly, the drain 14a of FET 14 is coupled to the input voltage 18 and the source 14b of FET 14 is coupled to the load 20 via a sense resistor 24, as shown. The circuit breaker IC 12 provides a drive signal to the gate 14c of the FET 14 via an OUTPUT pin 28.

The sense resistor 24 senses the load current supplied to the load 20 through the switch 14 and is coupled to the circuit breaker IC 12 via a SENSE pin 26, as shown. A shunt regulator 58 provides overvoltage protection to the circuit breaker IC 12. In the illustrative embodiment, the shunt regulator 58 is a ten volt Zener diode.

In operation, the circuit breaker 10 controls conduction of the NMOS FET 14. When the FET 14 conducts, load current is supplied to the load 20; whereas, when the NMOS FET 14 is turned off, current is prevented from flowing to the load, so as to protect the load from excessive current, such as may occur due to a short circuit condition. The NMOS FET 14 is fully turned on when its gate is brought to a voltage sufficiently higher than the source voltage in order to forward bias the gate-to-source junction, such as on the order of one volt gate-to source. Preferably however, the drive signal voltage is sufficient to provide on the order of seven to ten volts gate-to-source in order to ensure a lower resistance switch. A charge pump 38 generates a supply voltage sufficient to turn on the NMOS FET 14 and to provide a relatively low resistance switch, as will be described.

The circuit breaker IC 12 includes a VDD pin 32 through which power is supplied at start up. In particular, the IC 12 is initially powered by the input voltage 18 via a series resistor 34 and diode 36. A capacitor 40 is coupled between the VDD pin 32 and a VOUT pin 44, as shown. At start up, capacitor 40 is charged via resistor 34 and diode 36. Thereafter, the circuit breaker IC 12 is powered by the internal charge pump 38 which charges the reservoir capacitor 40. Current is prevented from flowing back to the input voltage source 18 by diode 36.

The VOUT pin 44 is coupled to the positive side of the load 20 as opposed to ground 22, to provide the chip reference voltage. Thus, the circuit breaker IC 12 effectively "floats" with respect to ground (i.e., is isolated from ground 22). With the circuit breaker referenced to VOUT, the IC 12 is prevented from experiencing significant voltage differentials across its input and negative reference pins (i.e., across the VDD pin 32 and a VSS pin 70 shown in FIG. 2). Specifically, the maximum voltage between the VDD pin 32 and the VSS pin 70 is established by the charge pump 38 and, in the illustrative embodiment is fifteen volts. Thus, the voltage limitation of an application in which the circuit breaker is used is restricted only by external component voltage limitations, such as the NMOS FET 14, and not by the circuit breaker IC itself. With this arrangement, a lower voltage, less expensive process is used to fabricate the circuit breaker chip 12.

Figure 2:
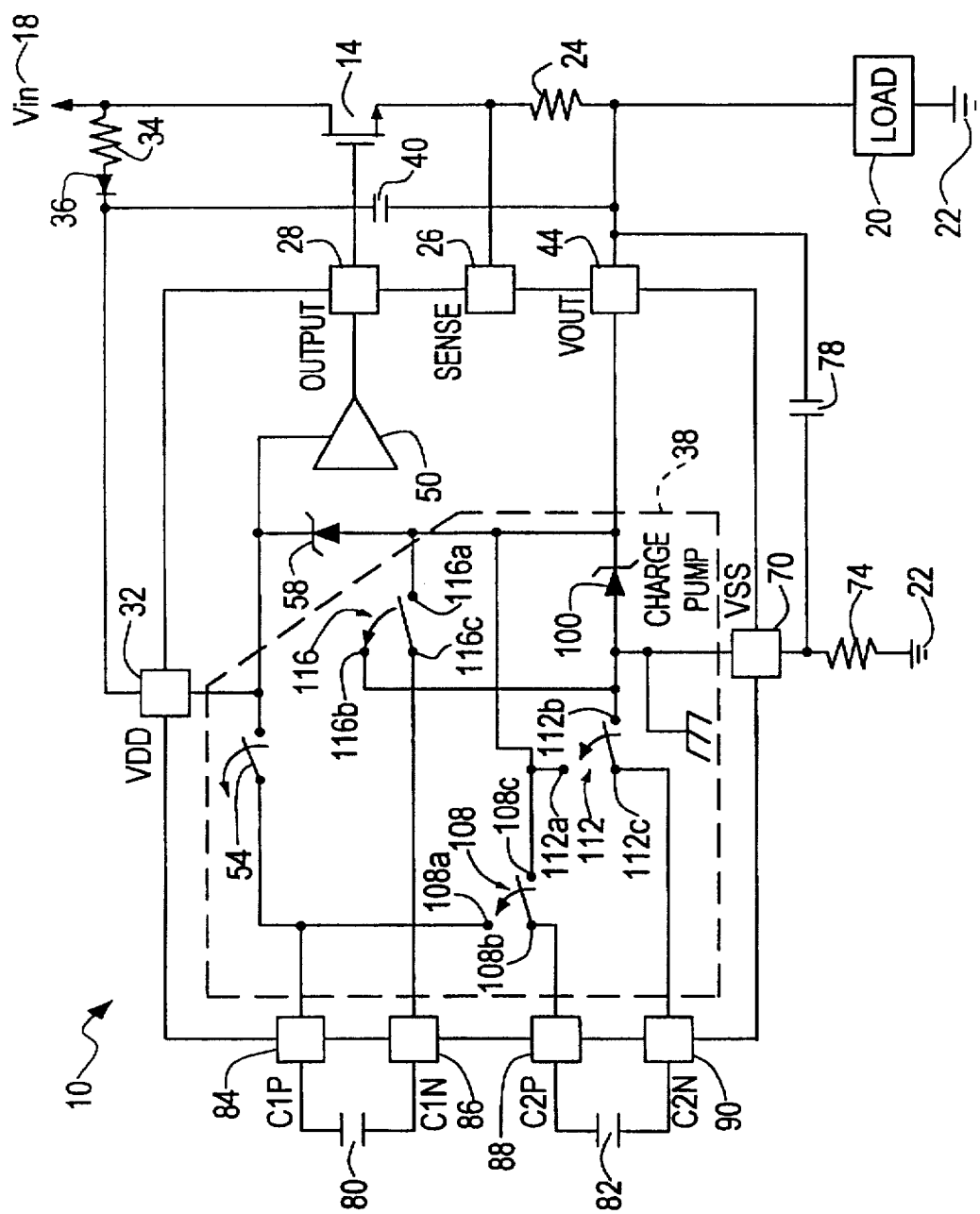
FIG. 2 is a more detailed schematic of the floating positive circuit breaker of FIG. 1.

An operational amplifier 50 has an output at which the drive signal for the NMOS FET 14 is provided. In operation, the amplifier 50 is powered by the charge pump 38. The charge pump 38 provides a nominal voltage of approximately 8.5 volts with respect to VOUT, or approximately 13.5 volts with respect to VSS (FIG. 2). With this arrangement, the positive circuit breaker 10 is able to lower the resistance of the NMOS switch 14.

Referring also to FIG. 2, the circuit breaker IC 12 includes the VSS pin 70 which provides a negative reference. That is, in order to generate a sufficient voltage with the charge pump 38 to drive the FET 14, a VSS voltage more negative than VOUT is generated. This is achieved with a Zener diode 100 of the charge pump 38. In the illustrative embodiment, a resistor 74 is coupled between the VSS pin 70 and ground 22 and a capacitor 78 is coupled between the VSS pin 70 and the VOUT pin 44, as shown. With this arrangement, current flows into the VSS terminal 70 from ground via resistor 74, without ground 22 being coupled to the chip. Capacitor 78 prevents excessive voltage from being developed between the VOUT pin 44 and the VSS pin 70, such as may occur due to transients at the VOUT pin 44.

The charge pump 38 is associated with external capacitors 80, 82 and 40. Capacitor 80 is coupled between a C1P pin 84 and a C1N pin 86 of the IC 12. Capacitor 82 is coupled between a C2P pin 88 and a C2N pin 90, as shown.

The charge pump 38 includes a plurality of switches. A two pole switch 54 is coupled between the C1P pin 84 and the VDD pin 32. Switch 54 may be a synchronous switch, as described herein. Alternatively however, switch 54 may be a diode having an anode coupled to the C1P pin 84 and a cathode coupled to the VDD pin 32 for the purpose of preventing charge from flowing from the VDD pin 32 into the charge pump 38.

A three pole switch 108 has a first terminal 108a coupled to the C1P pin 84, a second terminal 108b coupled to the C2P pin 88 and a third terminal 108c coupled to the VOUT pin 44. Switch 108 is adapted for being in a first position in which terminals 108b and 108c are interconnected, as shown, or a second position in which terminals 108a and 108b are interconnected. Another three pole switch 112 has a first terminal 112a coupled to the VOUT pin 44, a second terminal 112b coupled to the VSS pin 70 and a third terminal 112c coupled to the C2N pin 90. Switch 112 is adapted for being in a first position in which terminals 112b and 112c are interconnected, as shown, or a second position in which terminals 112a and 112c are interconnected. A third three pole switch 116 has a first terminal 116a coupled to the VOUT pin 44, a second terminal 116b coupled to the VSS pin 70 and a third terminal 116c coupled to the C1N pin 86. Switch 116 is adapted for being in a first position in which terminals 116a and 116c are interconnected, as shown, or a second position in which terminals 116b and 116c are interconnected.

In operation, the switches 54, 108, 112 and 116 are initially in their illustrated positions. With this arrangement, capacitor 82 is charged to five volts relative to VSS via Zener diode 58 and switches 108 and 112.

Thereafter, the position of each of the switches 54, 108, 112 and 116 is toggled. Specifically, switch 54 is opened, switch 108 is toggled to the second position in which terminals 108a and 108b are interconnected, switch 112 is toggled to the second position in which terminals 112a and 112c are interconnected and switch 116 is toggled to the second position in which terminals 116b and 116c are interconnected. This arrangement causes the voltage across capacitor 82 to be level shifted five volts higher, since the toggling of switch 112 causes the voltage at the C2N pin 90 to be shifted up by five volts with respect to VSS. Also, the charge on capacitor 82 is shifted to capacitor 80 via switch 108, pins C1P and C1N and switch 116. Thus, the voltage across capacitor 80 will eventually reach approximately ten volts relative to VSS.

Once the switches 54, 108, 112 and 116 toggle back to their original, illustrated positions, the voltage across capacitor 80 is level shifted five volts higher, since the toggling of switch 116 causes the voltage at the C1N pin 86 to be shifted up by five volts relative to VSS. With this arrangement, the charge pump 38 is able to provide approximately 8.5 volts of gate drive with respect to the source of the FET 14.

Figure 3:
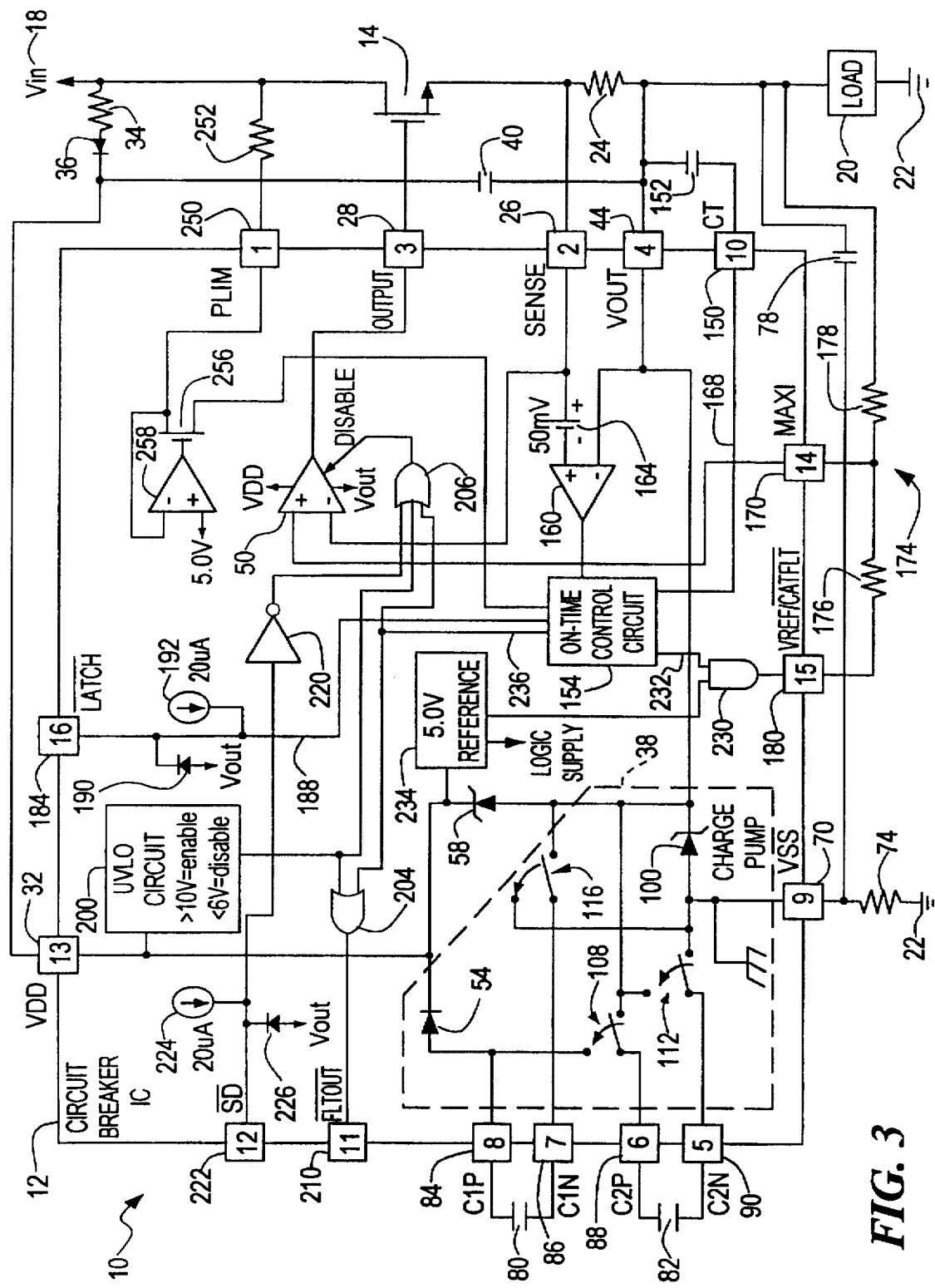
FIG. 3 is a still more detailed schematic of the floating positive circuit breaker of FIG. 1.

Referring also to FIG. 3, the circuit breaker 10 is shown in greater detail. The operational amplifier 50 has a non-inverting input coupled to a MAXI pin 170 and an inverting input coupled to the SENSE pin 26. The MAXI pin 170 is externally coupled to a resistor divider 174, including resistors 176 and 178. Resistor divider 174 is supplied by a VREF/CATFLT pin 180 which provides a fixed reference voltage in normal operation, so that the voltage at the MAXI pin 170 is likewise fixed. In particular, the voltage at the MAXI pin 170 is a maximum threshold voltage which corresponds to a maximum permissible load current level. The maximum threshold voltage and related maximum current level are programmable by adjusting the values of resistors 176 and 178.

In normal operation, when the load current is less than a programmable fault current level, the amplifier 50 provides a drive signal to the NMOS FET 14 which fully turns on the FET 14. Once the load current exceeds the fault current level, the switch 14 remains fully on for a predetermined duration, after which the switch 14 is turned off, as will be described. If the load current increases beyond the fault current level, to the maximum current level (Imax), then the amplifier 50 is operative to decrease conduction of the switch 14 in order to maintain a constant load current at the Imax level when conducting.

A CT pin 150 of the circuit breaker IC 12 is adapted for coupling to an external timing capacitor 152 which is further coupled to the VOUT pin 44, as shown. Capacitor 152 establishes the fault timing associated with the circuit breaker and thus, may be considered to provide a fault timer. In particular, the predetermined duration after the load current exceeds the fault current level and before the switch 14 is turned off corresponds to the time it takes to charge capacitor 152 to a predetermined voltage. Internally, the CT terminal 150 is coupled to an on-time control circuit 154 (FIG. 4) which provides charge and discharge currents to the capacitor 152.

Figure 4:
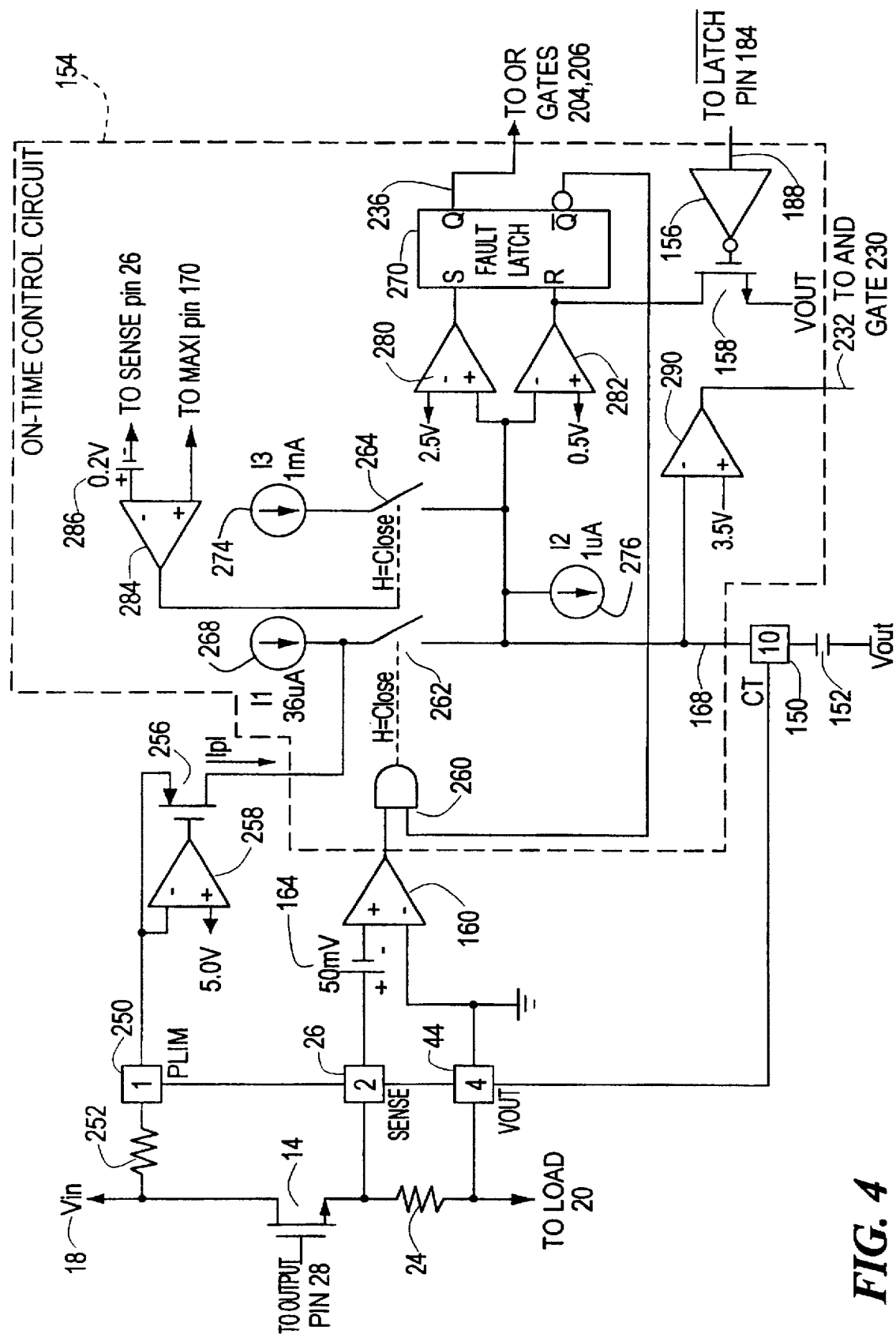
FIG. 4 is a schematic of the fault timing circuitry of the floating positive circuit breaker of FIG. 1.

The load current is sensed via the sense resistor 24 and an overcurrent comparator 160 which has a non-inverting input coupled to the SENSE pin 26 via a fifty millivolt offset 164 and an inverting input coupled to the VOUT pin 44, as shown. When the load current through the sense resistor 24 exceeds the fault current level (i.e., a current level which causes a fifty millivolt drop across the resistor 24), then the output of the overcurrent comparator 160 transitions to a high level and commences charging of the timing capacitor 152 via the on-time control circuit 154 (FIG. 4). More particularly, a charge current is supplied by the on-time control circuit 154 to the timing capacitor 152 via a signal line 168 and the CT pin 150. The fault current level is programmable by varying the resistance of sense resistor 24.

After a fault is detected and once the capacitor 152 is charged to the predetermined voltage, such as 2.5 volts, the amplifier 50 turns off the NMOS FET 14, thereby preventing any load current from being supplied. The amplifier 50 attempts to turn the FET 14 back on after a second predetermined duration, which is set by discharging the capacitor 152 to a second predetermined voltage, such as 0.5 volts.

A LATCH pin 184 of the circuit breaker IC 12 is adapted for receiving a LATCH signal 188 by which a fault condition may be latched. More particularly, a low LATCH signal 188 causes a fault latch (FIG. 4) within the on-time control circuit 154 to be set. The fault is latched until the LATCH signal is brought high or a power-on reset is attempted. A diode 190 is coupled between the LATCH signal line 188 and the VOUT pin 44 and a current source 192, such as the illustrative twenty microamp current source, is coupled to signal line 188, as shown. The current source 192 serves to pull-up the signal line 188 and the diode 190 prevents the signal line 188 from going more than a diode drop below the VOUT voltage.

An undervoltage lockout (UVLO) circuit 200 disables the circuit breaker IC 12 in the event that the VDD voltage is less than a predetermined minimum voltage, such as ten volts. The UVLO circuit 200 has hysteresis such that, once the VDD voltage exceeds the predetermined minimum voltage, the circuit breaker IC 12 remains active until the VDD voltage falls below a second, lower predetermined voltage, such as six volts.

The UVLO circuit 200 is coupled to two OR gates 204 and 206. The first OR gate 204 provides a fault indication via a FLTOUT pin 210. More particularly, a low voltage at the FLTOUT pin 210 indicates either an undervoltage lockout condition has been detected by the circuit 200 or that the fault timer has timed out (i.e., that the timing capacitor 152 has been charged to the first predetermined voltage). To this end, the OR gate 204 is further coupled to the on-time control circuit 154 via signal line 236.

The second OR gate 206 provides a disable feature, whereby the amplifier 50 is disabled in response to either an undervoltage lockout condition, an externally provided shutdown (SD) signal coupled to the SD pin 222 or the fault timer timing out as indicated by signal 236. The OR gate 206 has a first input coupled to the UVLO circuit 200, a second input coupled to an inverter 220 and a third input coupled to the on-time control circuit 154. The input to the inverter 220 is coupled to the SD pin 222. A current source 224, such as the illustrative twenty microamp current source, and a diode 226 are further coupled to the SD pin 222, as shown. The current source 224 pulls up the voltage at the SD pin 222 and the diode 226 prevents the voltage at the SD pin 222 from going more than a diode drop below the VOUT voltage. The OR gate 206 disables the amplifier 50, causing the FET 14 to be turned off, when an undervoltage lockout condition occurs, when the SD pin 222 is pulled low or when the fault timer times out.

The VREF/CATFLT pin 180 is provided at the output of an AND gate 230, as shown. A first input to the AND gate 230 is coupled to the on-time control circuit 154 and is responsive to a signal 232 which is indicative of whether or not a catastrophic fault has been detected. A second input to the AND gate 230 is coupled to a five volt reference 234, as shown. As long as a catastrophic fault is not detected by the on-time control circuit 154, the output of the AND gate 230 is provided by the reference voltage from the circuit 234. Alternatively, in the event that a catastrophic fault is detected (i.e., when the circuit breaker IC 12 unsuccessfully attempts to turn off the NMOS FET 14), the output of the AND gate 230 is low. In certain applications, it may be advantageous to provide a second NMOS FET (not shown) in series with the main NMOS FET 14 to be controlled by the VREF/CATFLT signal for purposes of redundancy. That is, in the event that the circuit breaker IC 12 is unsuccessful in an attempt to shut off the main NMOS FET 14, this redundant series NMOS FET would be turned off so as to protect the load from an overcurrent condition.

A power limit PLIM pin 250 of the circuit breaker is provided for the purpose of maintaining constant the average power dissipation of the NMOS FET 14. To this end, an external resistor 252 is coupled between the PLIM pin 250 and the drain of the NMOS FET 14. Internal to the circuit breaker 10, a PMOS FET 256 has a source connected to the PLIM pin 250 and to an inverting input of an operational amplifier 258. The output of the operational amplifier 258 is coupled to the gate of the PMOS FET 256 and the drain of the FET 256 is coupled to the on-time control circuit 154, as shown. The non-inverting input to the operational amplifier 258 is coupled to a reference voltage, such as the illustrative 5.0 volt reference.

The PMOS FET 256 provides a current to the on-time control circuit 154 which is used to vary the duty cycle of the NMOS FET 14 so as to maintain its power dissipation constant. In particular, when the voltage across the NMOS FET 14 exceeds a predetermined level, such as five volts, current will flow into the PLIM pin 250. This current adds to the fault timer charge current (the current charging timing capacitor 152) so as to reduce the duty cycle of the NMOS FET 14. Once the current into the PLIM pin 250 exceeds approximately thirty-six microamps, the average power dissipation of the FET 14 is given by:

$$P_{FET(avg)} = \text{MAXI} \cdot 1 \times 10^{-6} \cdot R252 \quad (1)$$

where MAXI is the voltage at the MAXI pin 170.

Referring also to FIG. 4, the on-time control circuit 154 includes an overload comparator 284 having a non-inverting input coupled to the MAXI pin 170 and an inverting input coupled to the SENSE pin 26 via a 0.2 volt offset 286. The overload comparator 284 senses when the load current reaches a predetermined level slightly above the maximum current level. In the event that the load current reaches this overload current level, the output of the comparator 284 goes high which causes the capacitor 152 to charge faster, as will become apparent.

The on-time control circuit 154 includes an AND gate 260 having a first input coupled to the output of the current sense comparator 160 and a second input coupled to the output of a fault latch 270. The output of the AND gate 260 controls a switch 262. Switch 262 has a first terminal coupled to a current source 268 and to the drain of the PMOS FET 256. A second terminal of the switch 262 is coupled to the CT pin 150.

A second switch 264 has a first terminal coupled to a current source 274 and a second terminal coupled to the CT pin 150, a third current source 276, the non-inverting input of a fault comparator 280 and the inverting input of a reset comparator 282, as shown. The fault comparator 280 has an inverting input coupled to a first reference voltage, such as 2.5 volts, and the reset comparator 282 has a non-inverting input coupled to a second reference voltage, such as 0.5 volts. The output of the fault comparator 280 sets the fault latch 270 and the output of the reset comparator 282 resets the fault latch 270.

Recall that a logic low $\overline{\text{LATCH}}$ signal 188 applied to the $\overline{\text{LATCH}}$ pin 184 latches a fault condition. In particular, the $\overline{\text{LATCH}}$ signal 188 is coupled to an inverter 156, the output of which is coupled to the gate of an NMOS FET 158. The NMOS FET 158 has a source connected to the VOUT voltage and a drain connected to the reset input to the fault latch 270. When the $\overline{\text{LATCH}}$ signal 188 is at a logic low level, the output of the inverter 156 is high which causes the NMOS FET 158 to turn on and pull the reset input of the fault latch 270 low, to VOUT, so as to prevent the fault latch from being reset. When the $\overline{\text{LATCH}}$ signal 188 is high, the NMOS FET 158 is off and thus, the fault latch 270 is able to be reset by the reset comparator 282.

The Q output of the fault latch 270 is coupled to inputs of OR gates 204 and 206 in FIG. 3. When the Q output is high, indicating that a fault condition exists, the signal at the FLTOUT pin 210 goes high, thereby indicating the existence of a fault. Also, when the Q output is high, the output of OR gate 206 goes high, thereby disabling the operational amplifier 50 and causing the FET 14 to turn off. The $\overline{\text{Q}}$ output of fault latch 270 is fed back to an input of the AND gate 260.

A catastrophic fault comparator 290 of the on-time control circuit 154 has an inverting input coupled to the CT pin 150 and a non-inverting input coupled to a reference voltage, such as 3.5 volts. In operation, if the voltage across the timing capacitor 152 exceeds 3.5 volts, then the output signal 232 of the comparator 290 transitions to a low level. This, in turn, causes the VREF/$\overline{\text{CATFLT}}$ output of the AND gate 230 to go low, indicating the presence of a catastrophic fault.

In operation, once the voltage across the sense resistor 24 exceeds the offset voltage 164, the output of the current sense comparator 160 goes high. As long as a fault condition has not been detected already (i.e., as long as the $\overline{\text{Q}}$ input to AND gate 260 is high), the output of the AND gate 260 goes high causing the switch 262 to close. With switch 262 closed, the current source 268 supplies thirty-six microamps of charge current to the timing capacitor 152 via the CT pin 150.

While the timing capacitor 152 is charging, the NMOS FET 14 continues to conduct. Once the voltage across the timing capacitor 152 reaches the first predetermined level of 2.5 volts, the output of the fault comparator 280 goes high, to set the fault latch 270. With the fault latch 270 set, the NMOS FET 14 turns off via OR gate 206.

In the event that the load current continues to climb, the charging of the timing capacitor 152 is speeded up, in order to turn off the NMOS FET 14 sooner. More particularly, if the voltage across the sense resistor 24 exceeds the offset voltage 286 associated with the overload comparator 284, then the output of the overload comparator goes high, thereby closing the switch 264. With switch 264 closed, the one milliamp of current from current source 274 adds with the current from current source 268 to charge the timing capacitor 152.

Once the fault latch 270 is set, the logic low $\overline{\text{Q}}$ output causes switch 262 to open via AND gate 260. With switch 262 open, the thirty-six microamps of charge current provided by current source 268 is prevented from charging the timing capacitor 152. With switches 262 and 264 open, the timing capacitor 152 is discharged via the one microamp current source 276. Once the voltage across the timing capacitor 152 falls to a second predetermined level of 0.5 volts, the output of the reset comparator 282 goes high, so as to reset the fault latch 270. With the fault latch 270 reset, the NMOS FET 14 may be turned on again since the amplifier 50 is no longer disabled. In the event that a fault is still present once the NMOS FET 14 is turned on, the overcurrent comparator 160 will cause switch 262 to close, repeating the cycle.

Recall that the average power amplifier 258 serves to maintain the power dissipation of the NMOS FET 14 substantially constant. To this end, the PMOS FET 256 sources current to the CT pin 150 when the voltage across the FET 14 exceeds a predetermined level, such as five volts. In particular, the amplifier 258 regulates the voltage at the PLIM pin 250 to five volts, thereby shunting any current through resistor 252 to PMOS FET 256. Specifically, the current sourced through the FET 256 is given by:

$$Ipl = \frac{V_{FET} - 5\ V}{R252}\ ,\ V_{FET} > 5\ V \tag{2}$$

where $V_{FET}$ is the voltage across the NMOS FET 14.

Figures 5, 6, 7:
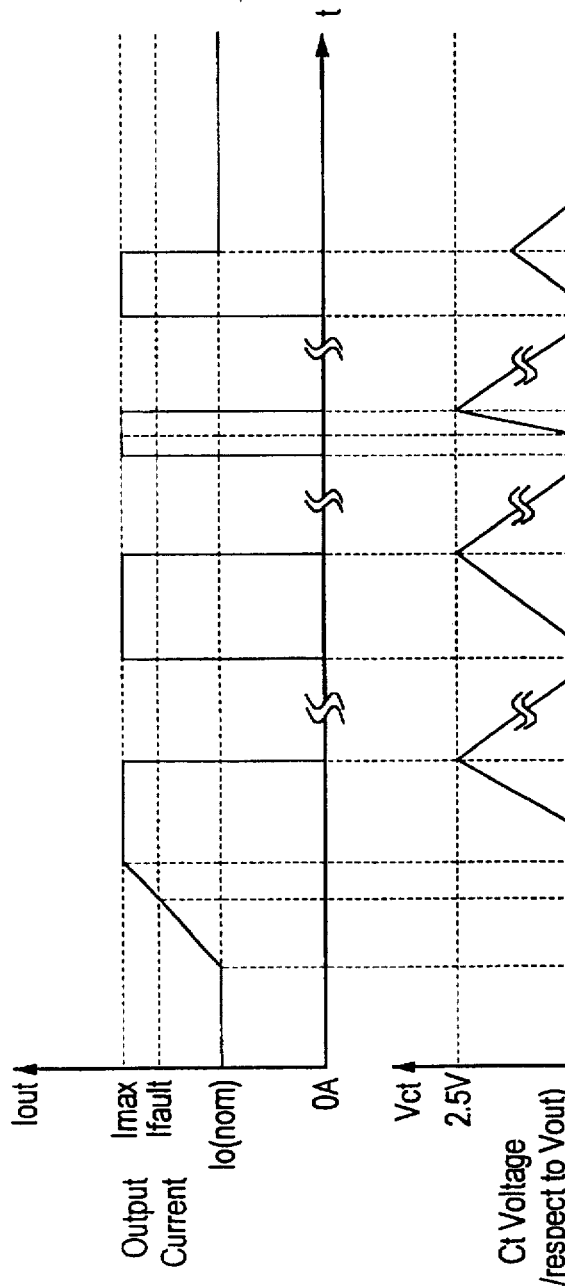
FIG. 5 is a timing diagram showing the circuit breaker output, or load current over time for illustrative operating conditions.
FIG. 6 a timing diagram showing the circuit breaker timing capacitor voltage over time for illustrative operating conditions.
FIG. 7 is a timing diagram showing the circuit breaker output voltage over time for illustrative operating conditions.

Referring also to FIGS. 5–7, various parameters of the circuit breaker 10 are shown. In particular, FIG. 5 shows the output, or load current provided to the load 20 via the NMOS FET 14, FIG. 6 shows the voltage across the timing capacitor 152 and FIG. 7 shows the output voltage provided at the VOUT pin 44 with respect to ground.

Prior to time $t_0$, the load current is at a nominal, safe level and the voltage at the load is approximately equal to the input voltage 18 since the switch 18 is fully on. At time $t_0$, the load current begins to increase.

By time $t_1$, the load current has increased to the fault current level, thus causing the output of the current sense comparator 160 to transition to a high level. With the fault level reached, the timing capacitor 152 begins to be charged, as shown in FIG. 6.

At time $t_2$, a second predetermined current level is reached corresponding to the maximum permissible current level Imax. At this point, the operational amplifier 50 causes a constant current to be sourced to the load through the FET 14. More particularly, when the maximum permissible current level Imax is reached, the amplifier 50 regulates the voltage at the gate of FET 14, so that the current through FET 14 is held substantially constant at the maximum permissible current level Imax.

At time $t_3$, the voltage across the timing capacitor 152 reaches 2.5 volts. This condition causes the output of the fault comparator 280 to go high and set the fault latch 270. With the Q output of latch 270 high, the operational amplifier 50 is disabled (via OR gate 206), thereby turning off the NMOS FET 14. With this arrangement, load current is prevented from flowing to the load 20 and the voltage at the VOUT pin 44 falls to zero volts, or ground. Also, the voltage across the timing capacitor 152 falls until it reaches 0.5 volts, at which point the output of the reset comparator 282 transitions to reset the fault latch 270.

Once the fault latch 270 is reset, the operational amplifier 50 is re-enabled and attempts to turn on the NMOS FET 14. More particularly, the amplifier 50 turns on the FET 14 at time $t_4$ so as to supply current to the load 20 and cause the VOUT voltage to climb. Since the load current is still greater than the fault current, charging of the capacitor 152 is commenced at time $t_4$.

At time $t_5$, the timing capacitor 152 has charged to 2.5 volts, thereby causing the switch 14 to open again until the capacitor 152 has discharged to 0.5 volts at time $t_6$, when it is attempted to re-close the switch 14. Operation of the circuit breaker between times $t_3$ and $t_5$ is at a three percent duty cycle, during which a fault current flows and repeated attempts at re-closing the switch 14 are made.

At time $t_6$, an attempt to re-close switch 14 is made and a fault current is again detected, causing the capacitor 152 to re-charge. However, before the voltage across the capacitor 152 gets to 2.5 volts, a short circuit condition is detected across the load 20 at time $t_7$. This short circuit condition causes a current Ipl to flow through the PMOS FET 256 to the CT pin 150 which combines with current from current source 268 to charge the timing capacitor 152. By time $t_8$, the voltage across the timing capacitor 152 has reached 2.5 volts, thereby causing the output of the fault comparator 280 to set the fault latch 270 and disable the amplifier 50 and the FET 14 which, in turn, causes the load current and VOUT voltage to fall, as shown.

Thereafter, between times $t_7$ and $t_8$, the capacitor 152 discharges to 0.5 volts, at which time the output of the reset comparator 282 transitions and resets the fault latch 270. At time $t_9$, another re-try is made to close the switch 14. Since the load current still exceeds the fault current, the capacitor 152 is again re-charged.

At time $t_{10}$, the fault is released and the load current falls to below the fault current. This condition causes the output of the current sense comparator 160 to transition to a low level and thus, the output of the AND gate 260 to go low, thereby opening switch 262 and terminating the charging of capacitor 152. Since a nominal load current flows from time $t_{10}$ on, the timing capacitor 152 is able to discharge all the way to zero volts, as shown.

Having described the preferred embodiments of the invention, it will now become apparent to one of skill in the art that other embodiments incorporating their concepts may be used. It is felt therefore that these embodiments should not be limited to disclosed embodiments but rather should be limited only by the spirit and scope of the appended claims.

We claim:

1. A circuit breaker for interruptingly providing current to a load from a power supply, the load having supply and reference terminals through which a desired load current is to flow and across which a desired load voltage is to appear, the power supply having a reference DC-coupled to the load reference, the power supply also having an output and being operable to supply the desired load current from the output while generating a supply voltage between the output and the reference substantially equal to the desired load voltage, the circuit breaker comprising:

an N-channel field-effect transistor (N-FET) the drain of which is to be DC-coupled to the output of the power supply, and the source of which is to be DC-coupled to the supply terminal of the load;

means for generating a current reference signal indicative of a maximum allowable load current;

a current sensor for generating a current sensor signal representing the magnitude of load current;

a charge pump having a positive terminal, a negative terminal, and a reference terminal, and means for generating a predetermined input voltage between the reference and negative terminals, the charge pump positive terminal to be DC-coupled to the power supply output in a manner providing for unidirectional current flow from the power supply output to the charge pump positive terminal during an initialization period in which the voltage of the charge pump positive terminal with respect to the power supply reference is less than the voltage of the power supply output with respect to the power supply reference, the charge pump negative terminal being DC-coupled to the power supply reference in a manner providing for current flow therebetween while allowing for substantial voltage difference therebetween, and the charge pump reference terminal being DC-coupled to the source of the N-FET and to the supply terminal of the load, the charge pump being operable to generate a charge pump output voltage between the charge pump positive terminal and the charge pump reference terminal, the charge pump output voltage being at least substantially the voltage required to fully turn on the N-FET and being substantially a multiple of the predetermined charge pump input voltage maintained between the charge pump reference terminal and the charge pump negative terminal;

an amplifier having an output, differential inputs, and positive and negative supply inputs, the amplifier positive and negative supply inputs being DC-coupled respectively to the positive and reference terminals of the charge pump, the amplifier output being DC-coupled to the gate of the N-FET, and the amplifier differential inputs being DC-coupled respectively to the current reference signal and to the current sensor signal, the amplifier being operable after the initialization period to drive the amplifier output to substantially the voltage of either the charge pump positive terminal or the charge pump reference terminal depending on the polarity of the difference between the current reference signal and the current sensor signal; and means for preventing the voltage between the positive and negative terminals of the charge pump from exceeding a predetermined maximum non-damaging charge pump operating voltage substantially smaller than the supply voltage.

2. The circuit breaker recited in claim 1 wherein the current-reference-signal generating means comprises means for generating a programmable fault threshold voltage corresponding to a fault current level.

3. The circuit breaker recited in claim 1 wherein said amplifier causes said N-FET to conduct said load current while said current sensor signal is less than said current reference signal and for a predetermined duration after said current sensor signal exceeds said current reference signal.

4. The circuit breaker recited in claim 3 further comprising a timing capacitor which charges to a predetermined voltage during said predetermined duration.

5. The circuit breaker recited in claim 4 further comprising a fault latch which is set once said timing capacitor is charged to said predetermined voltage, wherein said N-FET ceases conducting said load current when said fault latch is set.

6. The circuit breaker recited in claim 5 wherein said fault latch is reset when said timing capacitor is discharged to a second predetermined voltage.

7. The circuit breaker recited in claim 6 wherein said fault latch is responsive to a latch signal for preventing said fault latch from being reset.

8. The circuit breaker recited in claim 1 wherein said amplifier is further responsive to a programmable maximum threshold voltage corresponding to a maximum permissible current level for maintaining said load current substantially constant at said maximum permissible current level.

9. The circuit breaker recited in claim 1 further comprising a power limit circuit for maintaining power dissipation of said N-FET substantially constant.

10. The circuit breaker recited in claim 1 wherein said power supply reference voltage is ground.

* * * * *

UNITED STATES PATENT AND TRADEMARK OFFICE
CERTIFICATE OF CORRECTION

PATENT NO. : 5,793,596
DATED : August 11, 1998
INVENTOR(S) : Mark G. Jordan et al.

It is certified that error appears in the above-identified patent and that said Letters Patent is hereby corrected as shown below:

Title page, the Assignee should be added, and should read as follows:

--[73] Assignee: Unitrode Corp., Merrimack, NH--

In the heading, Attorney, Agent or Firm should be added, and should read as follows:

--Attorney, Agent or Firm - Weingarten, Schurgin, Gagnebin & Hayes LLP--

Column 7, line 11, "150" should read --150.--

Signed and Sealed this

Twenty-second Day of May, 2001

Attest:

NICHOLAS P. GODICI

*Attesting Officer*  *Acting Director of the United States Patent and Trademark Office*